United States Patent Office 3,544,319
Patented Dec. 1, 1970

3,544,319
PRODUCTION OF PRINTING PLATES

Adolf Diebold and Justus Walter Ludwigshafen, and Hugo Strehler, Frankenthal, Germany, assignors to Badische Anilin- & Soda-Fabrik Aktiengesellschaft, Ludwigshafen (Rhine), Germany No Drawing. Continuation-in-part of application Ser. No. 436,656, Mar. 2, 1965. This application Oct. 22, 1968, Ser. No. 769,724
Claims priority, application Germany, Mar. 6, 1964, B 75,760
Int. Cl. G03c 5/00
U.S. Cl. 96—36.3 4 Claims

ABSTRACT OF THE DISCLOSURE

Production of printing plates by photomechanical methods wherein the supporting polymer sheet is rendered electrically conducting by first applying a base metal and then depositing thereon a nobler metal, and coating the resulting layer with copper, nickel or chromium.

This application is a continuation-in-part of our application Ser. No. 436,656 filed Mar. 2, 1965, now abandoned.

This invention relates to a method of preparing printing plates or relief-bearing plates from multilayer plates or cylinders by photomechanical methods.

It is known that printing plates may be made from metals, such as copper or zinc, by providing a metal plate with a sensitized layer, such as gelatin containing silver salts or albumin containing chromium compounds, exposing the sensitized layer to light under a negative, developing the exposed layer, drying at elevated temperature and preparing the relief image by etching with acids, for example nitric acid, or iron(III) chloride solutions. The thickness of the metal plates depends on the method of printing. For printing plates which are to be used inter alia as wrap-around plates in rotary printing, the thickness is about 0.8 to 1.75 mm. It is difficult to prepare such plates because the metal is difficult to bend and does not always exhibit the necessary tolerances. Moreover the tensile strains occuring in the bending process change the finely granular structure of the surface and lead to deformation of the halftone dots. Preparation of these printing plates is difficult and has not been satisfactorily resolved from a qualitative viewpoint.

Printing plates based on metallized plastic sheets have also been proposed, but the prints obtainable in practice are unsatisfactory. For example, the metal layers in these plates become partly detached from the plastic sheets during etching, but certainly during printing. Moreover, the strength of the metal layers as such has been inadequate. This led to shifting of the printing portions and resulted in poor prints, particularly in multicolor autotype printing processes.

According to another process, sheets of ABS polymers (i.e. styrene-acrylonitrile copolymers containing butadiene polymers) are subjected to a seven-step treatment involving surface deglazing, surface cleaning, surface activation, coating with metal by a reductive method in a strongly alcoholic medium to render them conductive, electrolytic copper plating, polishing, and increasing the thickness of the metal layer by electrolytic methods. This treatment is extremely troublesome and only suitable for ABS polymers. Moreover, the application of the bottom layer of metal by a reductive method (step 4) is a rather delicate operation and frequently involves heavy losses of chemicals.

We have now found that printing plates can be prepared by photomechanical methods in which a sensitized copying layer applied to a supporting sheet is exposed to light and the exposed layer developed and etched, the supporting sheet being a metal-coated plastics sheet, while avoiding the said disadvantages, by using a supporting sheet prepared by applying to a plastics sheet finely divided iron by means of a binder, exchanging the iron for copper or silver by electroless or electrolytic methods, smoothing the metal layer thus applied and then reinforcing it with copper, nickel or chromium by electroless or electrolytic methods.

It is preferred to use as the copying layer, a layer of polyvinyl alcohols or albumen containing sensitizers, such as ammonium bichromate or chromium potassium sulfate. Sensitized colloid layers are also suitable, for example layers of gelatin in which preferably a silver halide, such as silver chloride or silver bromide, or another sensitizing agent, such as chromium silver bromide, has been uniformly dispersed in the conventional way. The copying layer (which is used in the thickness usually employed for the production of metallic printing plates) should as far as possible have the same light sensitivity throughout its entire thickness, i.e., from the surface of the layer down to the supporting sheet.

Suitable supporting sheets are plastics sheets which have been coated on only one surface or completely with metal, advantageously by the method according to Belgian patent specification No. 653,269. If only one surface of the sheet has been coated with metal, it is this coated side which bears the copying layer.

The sheets are rendered conductive by first applying iron and then exchanging this base metal for a nobler one, e.g. copper or silver. The iron particles have a diameter of not more than 2$\mu$, preferably 0.1 to 0.9$\mu$. The sheets thus rendered conductive are then smoothed by a conventional process, e.g. by satinizing in a calender. After the conductive layer has been smoothed it can be mirror polished, e.g. by means of rotating bronze brushes. The conductive sheets are provided with a coating of metal, preferably nickel or chromium, either by an electroless method (e.g. reductive deposition) or electrolytically. Metal coated plastics sheets whose metal layer has a thickness of 4 to 6$\mu$ (for example a copper-chromium layer, the copper layer being beneath the chromium layer). Thick layers may be advantageous for some purposes. These may be produced for example by first replacing iron by copper by an electroless method and then increasing the copper layer electrolytically to the desired thickness.

Plastics sheets which when coated with metal are suitable as supporting sheets consist for example of polyvinyl chloride, polyvinyl acetate, polystyrenes, copolymers of acrylonitrile, butadiene and styrene, and polyurethanes. Copolyamides, for example prepared from a mixture of equal parts of caprolactam, hexamethylenediamine adipate and diaminodicyclohexylmethane adipate, are very suitable. Polyamides, for example those from undecane dicarboxylic acid, heptadecane dicarboxylic acid and hexamethylene diamine are preferred. Regenerated celluloses and protein derivatives are also suitable. The material of which the sheets are made should advantageously be soluble or swellable in conventional solvents or swelling agents and not crosslinked.

The sensitized copying layer may be applied to the supporting sheet by conventional methods, for example by centrifuging, pouring, dipping or knife-coating.

Relief-bearing plates or cylinders may be prepared by conventional methods from the multilayer plates made according to this invention. According to an advantageous embodiment, printing blocks are prepared by exposing the printing plate or cylinder beneath a negative to a point source of light or to directed light (arc light). After having been exposed, the unexposed areas of the copying layer are dissolved away with conventional developing baths, such as alcohols, aqueous lactic acid solutions, water or weakly acid aqueous glycerin solutions. If necessary, any residual developing solution is removed, for example by development with alcohol when lactic acid solutions have been used. The relief image is then prepared by etching with the usual acids, such as nitric acid (for nickel), mixtures of hydrochloric acid and salt (for chromium), or salts, such as iron(III) chloride (for copper), or electrochemically by using the printing plate as an anode. Relief heights of 2 to 3μ are in general adequate for plates to be used in offset or intaglio printing. For plates which are to be used in letter set or relief printing, it is necessary to make the relief higher, the height being about 250 microns for letter set and about 500μ for relief printing. This may be advantageously achieved in a simple way by dissolving away the plastic to the necessary relief height after the metal layer has been etched through with the usual solvents.

Printing plates prepared in this way have high dimensional stability. Advantages over prior art plastics printing plates include sharpness of the halftone dots and the type elements. Their high abrasion resistance permits up to about 1,000,000 impressions to be taken. The metal on the surface takes up printing ink well and gives it up well to the surface to be printed or to the intermediate cylinder. The plates, after completion of printing, may be stored on a flat surface, whereas other plastics printing plates have to be stored in a curved condition. All shades, of both negative and positive originals, can be transferred to the plate without loss of delineation.

The following are advantages of printing plates according to this invention over prior art printing plates of metal and plastics in which the metal plate and a sheet of plastics are united for example by bonding or pressing:

Dispensing with the intermediate layer of adhesive which is required to join solid materials of metal and plastics and which in some cases exhibit properties different from those of the plastics used and thus make raising of the relief image in the plastics layer difficult. The use of laminated metal plates on sheets of plastics is expensive, because metals in compact form are limited to certain minimum thicknesses, whereas in the method according to this invention only a thin coating of metal is required.

The printing plates prepared according to this invention have the following advantages over prior art metal plates: they are more flexible, are cheaper in price and have a lower weight. Pictures have particularly sharp contours. The plates are therefore particularly suitable for rotary printing, equally well for single color and multicolor reproductions in line and halftone.

The printing plates may be prepared also by means of electronically controlled engraving equipment. Sheets having coatings of nickel or chromium are particularly suitable for this type of production.

The invention is further illustrated by the following examples. The parts specified in the examples are parts by weight.

EXAMPLE 1

Production of the printing plate 30 parts of the cocondensate of 80 wt. percent heptadecanedicarboxylic acid-4,4′-diaminodicyclohexylmethane salt (the heptadecanedicarboxylic acid being a mixture of approx. equal parts of heptadecanedicarboxylic acid-(1,8) and heptadecanedicarboxylic acid-(1,9)) and 20 wt. percent caprolactam, 68 parts iron powder having an average particle sige of 0.5μ and 2 parts anhydrous sodium salt of sulfated oleic dibutylamide are homogeneously dispersed in 100 parts propanol.

Using this dispersion a 0.5-mm. plate, consisting of a cocondensate prepared from a mixture of equal parts of caprolactam, hexamethylenediamine adipate and 4,4′-diaminodicyclohexylmethane adipate is coated by dipping. The coated plate is allowed to dry and then immersed in an acid bath which contains per liter 100 g. cooper sulfate (crystalline), 15 g. glutamic acid, 20 g. tartaric acid, 12 g. sulfamic acid and 10 g. diethanolamine. A coherent layer of copper approx. 1μ in thickness is formed which exhibits good conductivity. The copper layer is increased electrolytically with copper to a thickness of 8μ, then a 2μ layer of chromium is electrolytically deposited and finally a 3 to 5μ gelatin coating sensitized with silver bromide is applied.

Production of the relief image

The plate prepared as described above is exposed under a halftone transparency by means of an arc lamp (60 a.) for twelve to fifteen minutes. Then the metal is bared at the unexposed areas with acidified aqueous glycerin solution. The metal is then etched away at the unexposed areas by means of a mixture of hydrochloric acid, calcium chloride and calcium hypochlorite to remove the chromium layer at the image areas. The printing plate is suitable for the offset method.

EXAMPLE 2

Production of the printing plate

A 0.8 mm. plate consisting of a copolyamide of equal parts of hexamethylenediamine adipate, 4,4′-diaminodicyclohexylmethane adipate and caprolactam is coated by spraying with a 50μ layer of the dispersion described in Example 1 which contains iron powder. The dispersion is allowed to dry, a solid coating approx. 5μ in thickness remaining behind.

The plate thus treated is coated in an acid bath with a 1.5μ coherent layer of copper as described in Example 1. The copper layer is increased elecetrolytically with copper to a thickness of 4μ, then a 4μ layer of chromium is electrolytically deposited and finally an approx. 5μ coating of polyvinyl alcohol sensitized with chromium potassium sulfate is applied.

Production of the relief image

The plate obtained is exposed under a halftone negative by means of an arc lamp (60 a.) for twelve to fifteen minutes and then developed with aqueous glycol solution. The chromium is then removed from the bared places with a calcium chloride solution containing free hydrochloric acid and an oxidizing agent, and then the copper beneath the same is removed with an aqueous iron(III) chloride solution of 38° Baumé strength. Finally the relief is raised to about 250 microns by rubbing away the polyamide with a 1:1 mixture of n-propanol and water. The printing plate is suitable for the letter set method. Printing plates which are suitable for the relief printing method are obtained by rubbing away more of the polyamide layer to a relief height of about 500 microns. The negative, for example for letter set printing, should be left-handed, while for direct book printing it should be right-handed.

EXAMPLE 3

Continuous production of offset sheets

Continuous PVC sheeting 350μ in thickness is uniformly coated to a thickness of approx. 60μ with a dispersion in which 70 parts of iron powder with a mean particle size of approx. 0.4μ, 29 parts of a copolymer of equal parts of vinyl chloride and vinyl acetate and 1 part stearic acid are homogeneously dispersed in 100 parts of a 1:1 mixture of toluene and tetrahydrofuran. The coated material is dried in a heating tunnel so that the solvent mixture is evaporated and an approx. 6μ coating of iron powder remains behind. After drying, the coated sheeting is passed over calender rollers and exposed to a pressure of approx. 8 atm. gauge. By passing the highly glossy sheeting at room temperature through a cascade of vessels filled with acid baths containing 150 g./l. copper sulfate, 20 g./l. glycocoll and 10 g./l. triethanolamine and having been adjusted to pH 1.0–1.7 with dilute sulfuric acid, all the iron present is replaced by copper, a coherent, electrically conductive layer being formed. An approx. 8μ coating of copper is deposited on the said layer at a current density of approx. 3 amps/dm.$^2$ in acid baths by contacting with cathodically connected rollers and the coating is treated with an acid chromium bath to produce an approx. 3μ layer of chromium. The sheeting is washed, dried, sensitized by the application of an approx. 4μ layer of polyvinyl alcohol containing ammonium bichromate and finally cut to the required lengths.

Production of the relief image

A section cut from the sheeting thus prepared which has been exposed and developed as described in Example 1 provides a printing plate which gives particularly good results in rotary offset printing. The image sharpness is excellent and the plate is very suitable for multicolor printing.

EXAMPLE 4

Production of a printing roller

A seamless cylinder of polycaprolactam having a wall thickness of 20 mm., a diameter of 300 mm. and a length of 1600 mm. is coated externally with an approx. 50μ layer of a dispersion consisting of 70 parts iron having a mean particle size of 0.5μ, 29 parts of a copolymer of 80% heptadecanedicarboxylic acid-4,4′-diaminodicycylohexylmethane salt and 20% caprolactam and 1 part of the anhydrous sodium salt of dinonyl sulfosuccinate in 100 parts propanol. An approx. 5μ coating is obtained by drying in the air.

After drying, the cylinder is coppered by immersing in acid baths containing 100 g./l. copper sulfate, 15 g./l. aminoacetic acid, 10 g./l. citric acid, 20 g./l. sulfuric acid and 15 g. triethanolamine. The highly conductive approx. 1μ layer of copper is increased electrolytically in an acid bath to 250μ and polished.

After coating with a photosensitive layer in accordance with Example 1 the cylinder surface is exposed and etched. It is suitable for use in intaglio printing.

The cylinder can be used several times by machining the relief image down, recoppering, polishing and applying a new photosensitive layer.

We claim:

1. A process for the production of printing plates by photomechanical technique which comprises applying to a plastic sheet a thin coating of a binder containing finely divided iron particles having a diameter of not more than two microns, exchanging the iron in said coating with copper or silver by the electroless technique by immersion of said coated plastic sheet in an aqueous acidic bath of a salt of one of said metals, smoothing the resultant layer thus obtained by said electroless technique, applying at least one additional layer to said smoothed layer of at least one of the metals copper, nickel and chromium, and then applying a photosensitive copying layer to the resultant coated plastic sheet.

2. A process as claimed in claim 1 wherein said layer of at least one of said metals is applied by the electroless deposition of said metal on said smoothed layer.

3. A process as claimed in claim 1, wherein said one of said metals is applied to said smoothed layer by electrolytic deposition.

4. A process for production of printing plates comprising exposing to light a printing plate obtained by the process as claimed in claim 1, developing said photosensitive layer, and etching said plate.

References Cited

UNITED STATES PATENTS

| | | | |
|---|---|---|---|
| 2,257,143 | 9/1941 | Wood | 96—36.3 |
| 2,662,831 | 12/1953 | Culverhouse | 117—130 X |
| 2,977,227 | 3/1961 | De Maria | 96—36.3 |
| 3,201,239 | 8/1965 | Neugebauer et al. | 96—36.3 |
| 3,226,256 | 12/1965 | Schneble et al. | 117—217 X |

OTHER REFERENCES

"ABS Joins Plastics That Can Be Plated," C & E News, Mar. 25, 1963, pp. 48–49.

DONALD LEVY, Primary Assistant

R. E. MARTIN, Assistant Examiner

U.S. Cl. X.R.

101—463; 117—17.5, 217

PO-1050
(5/69)

UNITED STATES PATENT OFFICE
CERTIFICATE OF CORRECTION

Patent No. 3,544,319 Dated December 1, 1970

Inventor(s) Adolf Diebold et al

It is certified that error appears in the above-identified patent and that said Letters Patent are hereby corrected as shown below:

Column 1, line 3, "Walter" should read -- Walter, --.

Column 3, line 68, "sige" should read -- size --.

Column 4, line 1, "cooper" should read -- copper --.

SIGNED AND
SEALED
MAR 2 1971

(SEAL)
Attest:

Edward M. Fletcher, Jr.
Attesting Officer

WILLIAM E. SCHUYLER, JR.
Commissioner of Patents